(12) United States Patent  (10) Patent No.: US 9,384,820 B1
Parik et al.  (45) Date of Patent: Jul. 5, 2016

(54) ALIGNING CALIBRATION SEGMENTS FOR INCREASED AVAILABILITY OF MEMORY SUBSYSTEM

(71) Applicant: Apple Inc., Cupertino, CA (US)

(72) Inventors: Neeraj Parik, San Jose, CA (US); Thejasvi Magudilu Vijayaraj, San Jose, CA (US); Kai Lun Hsiung, Fremont, CA (US); Yanzhe Liu, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/738,119

(22) Filed: Jun. 12, 2015

(51) Int. Cl.
G11C 7/22 (2006.01)
G11C 11/4076 (2006.01)
G11C 11/406 (2006.01)
G11C 11/4096 (2006.01)

(52) U.S. Cl.
CPC ........ G11C 11/4076 (2013.01); G11C 11/4096 (2013.01); G11C 11/40615 (2013.01)

(58) Field of Classification Search
CPC ...... G11C 7/1048; G11C 7/1072; G11C 8/18; G11C 11/4072; G11C 11/4076; G11C 11/40603; G11C 11/40618; G11C 2207/2254; G11C 2211/4061
See application file for complete search history.

(56) References Cited

U.S. PATENT DOCUMENTS 6,310,814 B1  10/2001  Hampel et al.
7,321,524 B2 *  1/2008  Shaeffer .............. G06F 13/1689
                                                       365/191
8,423,813 B2  4/2013  Huang
8,638,613 B1  1/2014  Wu et al.
8,868,823 B2  10/2014  Moro
9,165,637 B2 *  10/2015  Kim ................. G11C 11/40622
2013/0227183 A1  8/2013  Shaeffer

OTHER PUBLICATIONS

Plessas et al., "Advanced Calibration Techniques for High-Speed Source-Synchronous Interfaces", IET Comput. Digit. Tech., 2011, vol. 5, Iss. 5, pp. 366-374.*

* cited by examiner

*Primary Examiner* — Andrew Q Tran
(74) *Attorney, Agent, or Firm* — Meyertons, Hood, Kivlin, Kowert & Goetzel, P.C.; Erik A. Heter

(57) ABSTRACT

A method and apparatus for aligning calibration segments for increased availability of a memory subsystem is disclosed. In one embodiment, a memory subsystem includes a memory and a memory controller coupled thereto via a number of independently operable channels (interfaces). The memory controller may convey on each of the channels at least one corresponding data strobe signal. The data strobe signal in each channel may be periodically calibrated. The memory controller may be configured to align the periodic calibrations in time so that they are performed concurrently instead of in a staggered manner. During the time the calibrations are performed on each channel, the memory may be unavailable for normal accesses.

20 Claims, 5 Drawing Sheets

ALIGNING CALIBRATION SEGMENTS FOR INCREASED AVAILABILITY OF MEMORY SUBSYSTEM

BACKGROUND

1. Technical Field

This disclosure is directed to electronic systems, and more particularly, to memory subsystems.

2. Description of the Related Art

Memory subsystems in computers and other electronic systems typically require various operations to be performed to ensure proper operation. In memory subsystems using dynamic random access memory (DRAM), refreshes are periodically performed to ensure the integrity of the stored data, which can be affected by leakage currents. One type of refresh may include reading the data stored in the memory and writing it back to the memory. Some DRAM components are also configured to perform a self-refresh, which involves entering a low power state and is performed independently of a memory controller.

Calibrations of data strobe signals may also be performed in memory subsystems. A data strobe signal is a clock signal that is used to synchronize data that is read from or written to a memory. In some systems, separate data strobe signals are provided for read and write operations. Calibrating the data strobe signals includes aligning clock edges of the data strobe with data conveyed to and/or from the memory to ensure sufficient setup and hold times for each data bit.

Some memory subsystems include multiple channels, or interfaces, coupled between a memory controller and a corresponding memory. Each channel may include its own data strobe signal(s). Calibrations of these data strobe signals are typically staggered such that some channels remain available for performing memory accesses while calibrations are being performed on others. Similarly, refreshes may also be staggered to ensure the availability of at least some memory channels while others are refreshed.

SUMMARY

A method and apparatus for aligning calibration segments for increased availability of a memory subsystem is disclosed. In one embodiment, a memory subsystem includes a memory and a memory controller coupled thereto via a number of independently operable channels (interfaces). The memory controller may convey on each of the channels at least one corresponding data strobe signal. The data strobe signal in each channel may be periodically calibrated. The memory controller may be configured to align the periodic calibrations in time so that they are performed concurrently instead of in a staggered manner. During the time the calibrations are performed on each channel, the memory may be unavailable for normal accesses.

In one embodiment, the memory may be a dynamic random access memory (DRAM) for which periodic refreshes are performed. Similar to the calibration, the memory controller may initiate an all-bank refresh of the memory utilizing all channels concurrently. Thus, during these refreshes, the memory may be unavailable for normal accesses.

BRIEF DESCRIPTION OF THE DRAWINGS

The following detailed description makes reference to the accompanying drawings, which are now briefly described.

Figure 1:
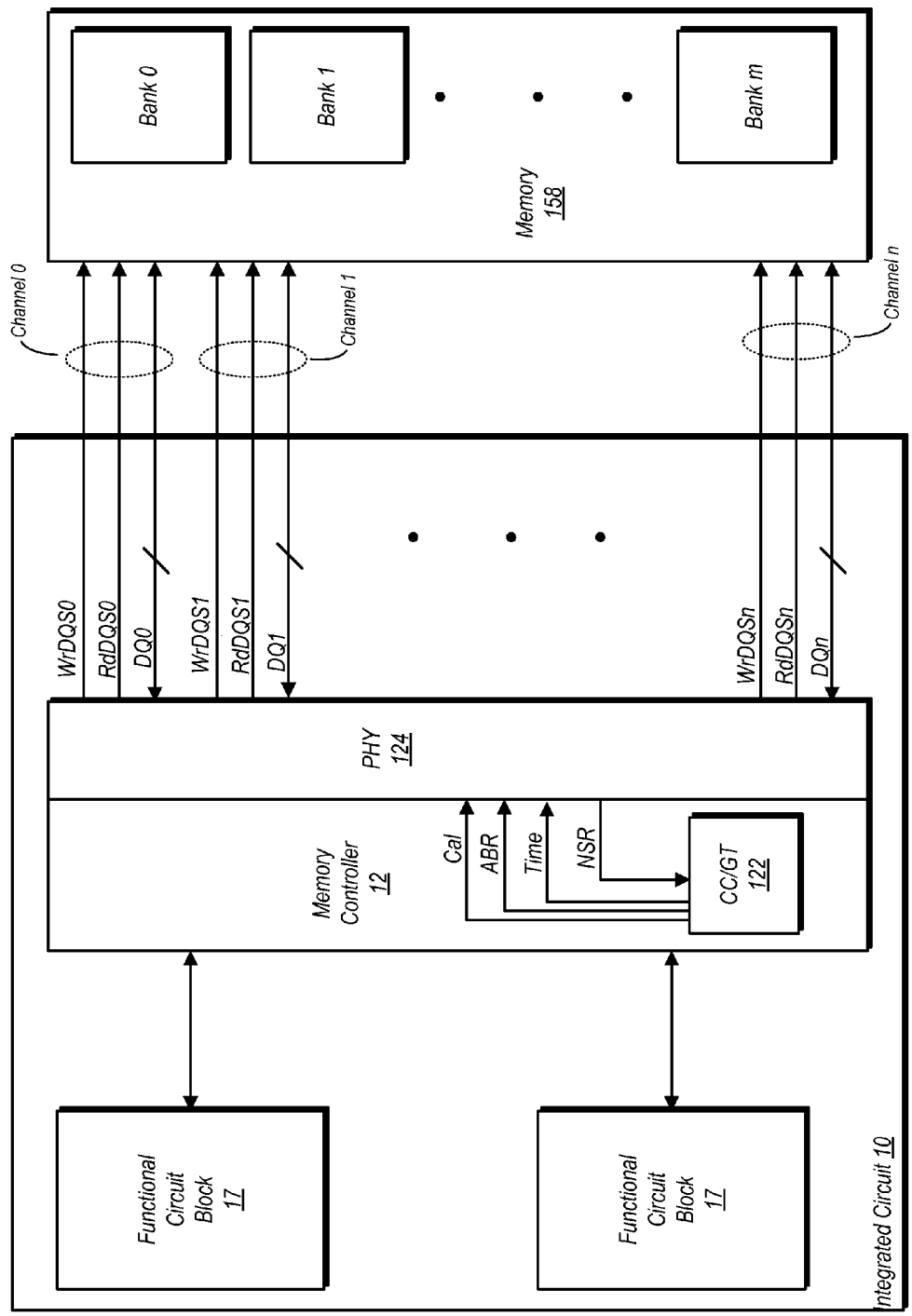
FIG. 1 is a block diagram of one embodiment of a system including a memory subsystem.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) (or pre-AIA paragraph six) interpretation for that unit/circuit/component.

DETAILED DESCRIPTION OF EMBODIMENTS

Turning now to FIG. 1, a block diagram of one embodiment of a system including a memory subsystem is shown. It is noted that the system shown in FIG. 1 is exemplary and presented here for illustrative purposes.

In the embodiment shown, integrated circuit (IC) 10 is coupled to memory 158. Memory 158 in this embodiment is a multi-bank memory having m banks, where m is an integer number. Moreover, memory 158 in this embodiment is a dynamic random access memory (DRAM).

IC 10 includes a memory controller 12, which taken with memory 158, form the memory subsystem. IC 10 also includes functional circuit blocks 17, which may access the memory 158 via memory 12. The functional circuit blocks may include various types of functional circuitry, such processor cores, graphics processing circuitry, bus interface circuitry, and so forth. In addition to the functional circuit block 17, other off-chip circuitry (i.e. not implemented on IC 10) may also access memory 158 through memory controller 12.

Memory controller 12 and memory 158 in the embodiment shown are arranged to communicate with one another through n independent channels, wherein n is an integer number. Each of the channels as shown here is bi-directional, and thus may be used for read and write accesses to memory 158. However, embodiments in which some channels are used exclusively for reading and others are used exclusively for writing are possible and contemplated.

Memory controller 12 includes a physical interface (PHY) 124 which is configured to transmit and receive signals from memory 158. In this embodiment, PHY 124 is configured to convey a respective read data strobe (RdDQS) and a respective write data strobe (WrDQS) signal on each of the channels. The read and write data strobe signals are used to synchronize data conveyed between memory 158 and memory controller 12 during read and write operations, respectively. Data is also conveyed on each channel, e.g., DQ0 on Channel 0, DQ1 on Channel 1, etc. The width of the data conveyed on each channel may correspond to the data width of the memory overall, e.g., if the memory is a 32-bit memory, then 32 bits of data are conveyed on each channels.

As noted above, each of the channels shown herein is independent from one another. Accordingly, read/write operations may occur on each channel independent of the operations occurring on other channels. For example, a read of data may occur on Channel 0 while a write of data may occur on Channel 1, and so forth.

In order to ensure proper operation and storage of data in memory 158, various operations may be periodically be performed. In particular, calibrations and memory refreshes are periodically performed. The calibrations include calibrating each of the read and write data strobe signals to be aligned with data transmitted during read and write operations, respectively. The refresh operations include performance of an all-bank refresh in which the data stored in memory is read and re-written thereto to ensure its integrity.

During the calibrations and refreshes discussed above, the channels coupled between memory controller 12 and memory 158 are unavailable. In prior art embodiments, memory availability may be maintained by scheduling a limited number of channels to be unavailable at a given time, while other may remain available. For example, in an eight-channel embodiment, a calibration may be performed on one channel while the other seven channels may remain available for normal read/write operations. However, memory traffic involving a given agent (e.g., one of functional blocks 17) may often times be distributed across all eight channels. In some cases, this may cause memory traffic between a given agent and memory 158 to stall for an undesirable or unacceptable amount of time. In order to avoid this problem, memory controller 12 in the embodiment shown may align the calibrations in time such that calibrations are performed across all channels concurrently. Similarly, memory controller 12 may also schedule all bank refreshes to be performed using all channels concurrently. During the performing of the calibrations and all-bank refreshes, memory 158 is unavailable for normal memory accesses by other agents. However, by scheduling the calibrations to be performed concurrently, as well as the refreshes, the problems noted above may be avoided, as all channels are available when these operations are not being performed. It is noted that the calibrations and all-bank refreshes are spaced in time from one another to reduce the amount of time that memory 158 is unavailable.

To support the operations described above, memory controller 12 includes a control circuit/global timer (CC/GT) 122. The global timer portion of CC/GT 122 may include counters and/or other timekeeping circuits that track the amount of time since previous instances of the operations. In particular, the global timer may track the time elapsed since the most recent instance of the calibration operation, as well as the time elapsed since the most recent instance of the all-bank refreshes. The global timer portion of CC/GT 122 may provide an indication after a first predetermined time has elapsed since the most recent instance of the calibration operation has been performed, and another indication after a second predetermined time has elapsed since the most recent instance of the all bank refresh has been performed. It is noted that the first and second predetermined times may be equal to one another, while the calibration and all-bank refresh operations are spaced in time from one another.

Figure 2:
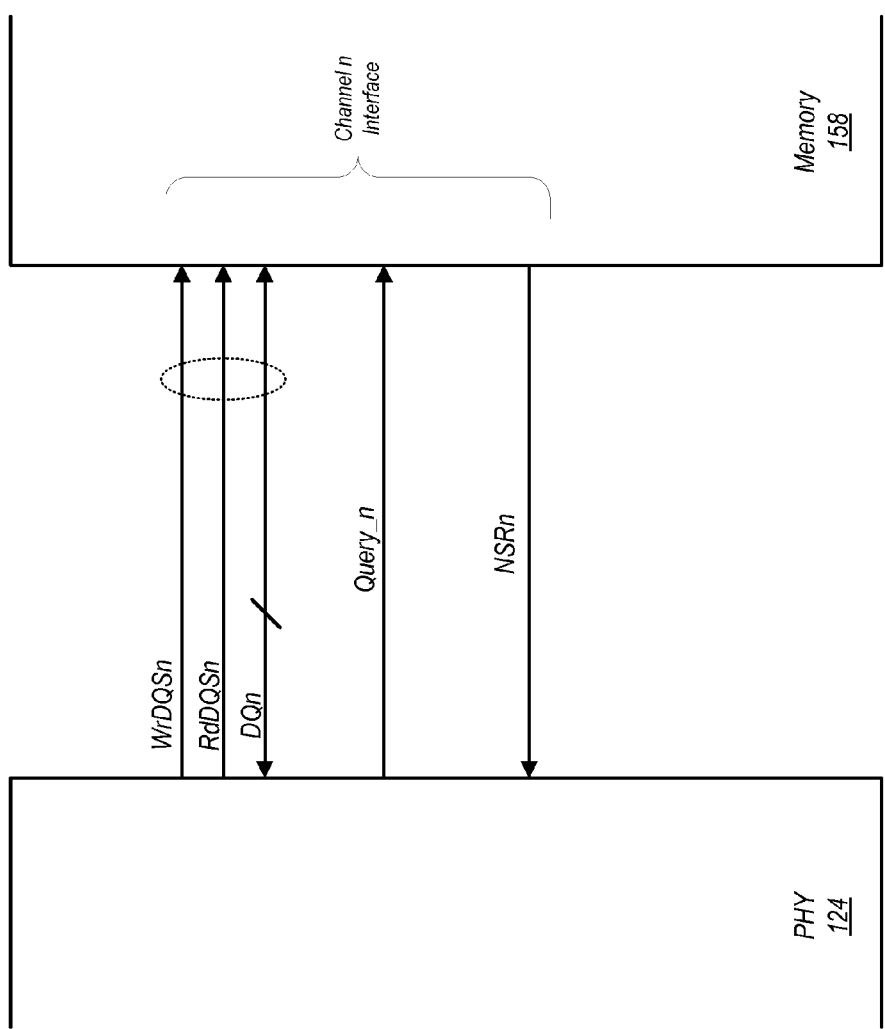
FIG. 2 is a block diagram illustrating additional details of one embodiment of an interface between a memory controller and a memory.

Responsive to elapsing of either of the first predetermined time or second predetermined time, the timer may assert the 'Time' signal. Responsive to assertion of the 'Time' signal, PHY 124 may assert, in each channel, a query signal, 'Query_n' (where 'n' corresponds to the channel number), as shown in FIG. 2. The query signal is a query to determine if a self-refresh is being performed in memory 158. If no self-refresh is being performed, memory 158 may return the signal NSRn, indicating the same. The individual instances of the NSRn signal may be aggregated (e.g., by ORing) into a single NSR signal that is returned to CC/GT 122. If a calibration is to be performed, CC/GT 122 may assert the calibration signal 'Cal', thereby initiating the data strobe calibrations across all channels concurrently responsive to receiving the asserted NSR signal. If an all-bank refresh is to be performed, CC/GT may assert the all-bank refresh signal, 'ABR', responsive to receiving the asserted NSR signal. An all-bank may then be performed, refreshing each of the m banks of memory utilizing each of the n channels. As noted above, memory 158 is not available for normal read/write accesses by other agents within the system while performing the calibrations or all-bank refresh across all channels concurrently.

Figure 3:
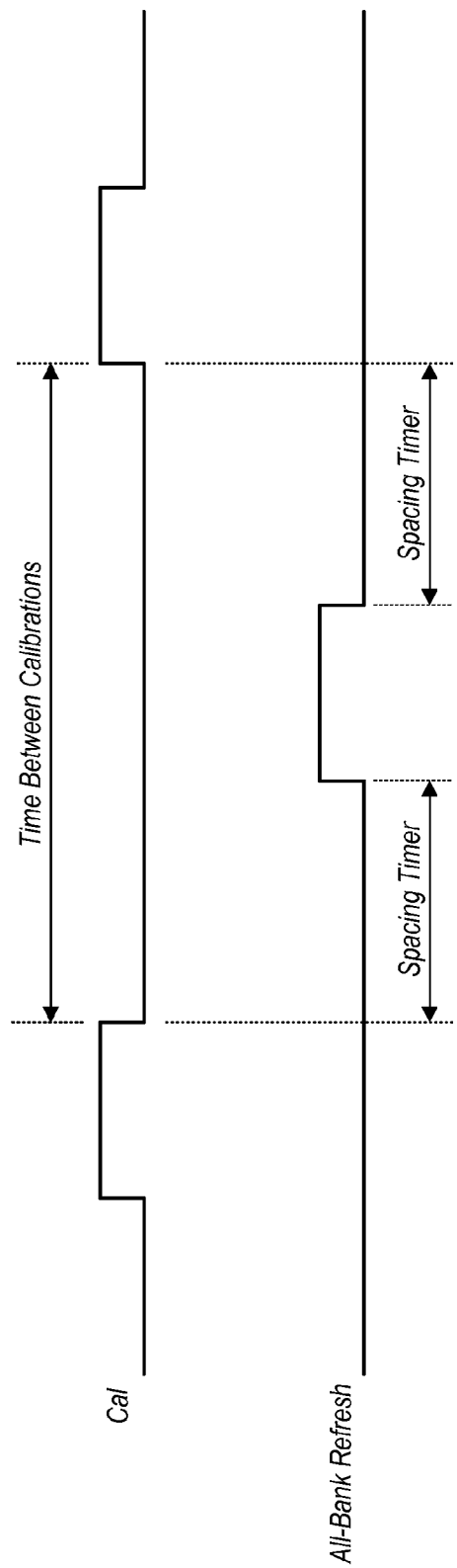
FIG. 3 is a timing diagram illustrating the timing of periodic calibrations and periodic all-bank refreshes.

FIG. 3 is a timing diagram illustrating the spacing in time of the periodic calibrations and the all-bank refreshes. It is noted that this timing diagram is not drawn to scale, but is instead provided for the purpose of illustrating the spacing of the calibrations relative to each other as well as the all-bank refreshes.

As shown in the drawing, the all-channel calibrations may be performed at evenly spaced intervals (e.g., 'the first predetermined time'). The all-bank refreshes may be performed during the interval between the calibrations. As shown here, the all-bank refreshes may be performed approximately half way between the periodic calibrations, although this is not a requirement. Although not shown, the intervals between instances of performing the all-bank refreshes may be the same as those between the instances of the calibrations.

Figure 4:
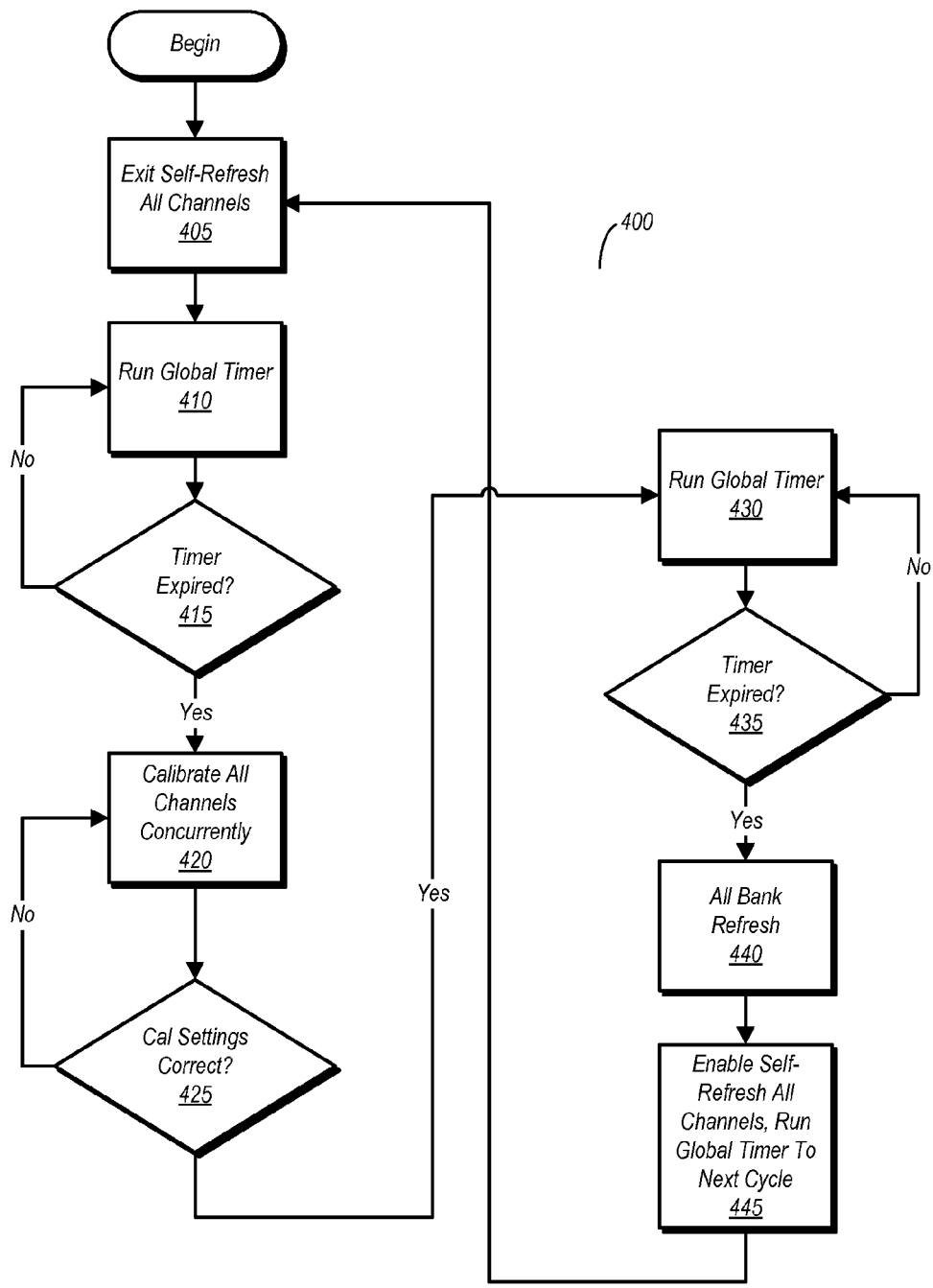
FIG. 4 is a flow diagram illustrating a method for performing periodic calibrations and periodic refreshes to a memory.

FIG. 4 is a flow diagram illustrating a method for performing periodic calibrations and periodic refreshes to a memory. Method 400 as shown here may be performed with various embodiments of the hardware described above. Additionally, method 400 may be performed with hardware embodiments not explicitly discussed herein. In this particular embodiment, the calibrations of the data strobe signals and all-bank refreshes are performed in conjunction with one another.

Method 400 in the embodiment shown begins with exiting/disabling self-refresh across all channels (block 405). Thereafter, a global timer is reset and begins running (block 410). The time continues running if it has not expired, indicating that a first duration has elapsed (block 415, no). If the first duration has elapsed (block 415, yes), then calibrations of the data strobe signals begin on all channels concurrently (block 420). The calibrations may begin substantially simultaneously, and the memory is unavailable for normal read/write accesses by other agents in the system. Each channel may be calibrated until its respective data strobe signals are in a desired alignment with the data conveyed on that channel. If data strobe signals for one or more channels remain misaligned (block 425, no) the calibration process continues. Once all data strobe signals are aligned and the calibration settings are correct (block 425, yes), the global timer begins running again (block 430).

Once it is running again, the global timer may run for a second duration. If the second duration has not been reached (block 435, no), the timer continues running. Once the timer has expired (block 435, yes), an all bank refresh is performed utilizing all of the channels (block 440). After completion of the all bank refresh, the self-refresh capability is once again enabled, and the global timer begins running again until such time when the next cycle of calibrations/all bank refresh is to be performed (block 445). Thereafter, the method returns to block 405.

Figure 5:
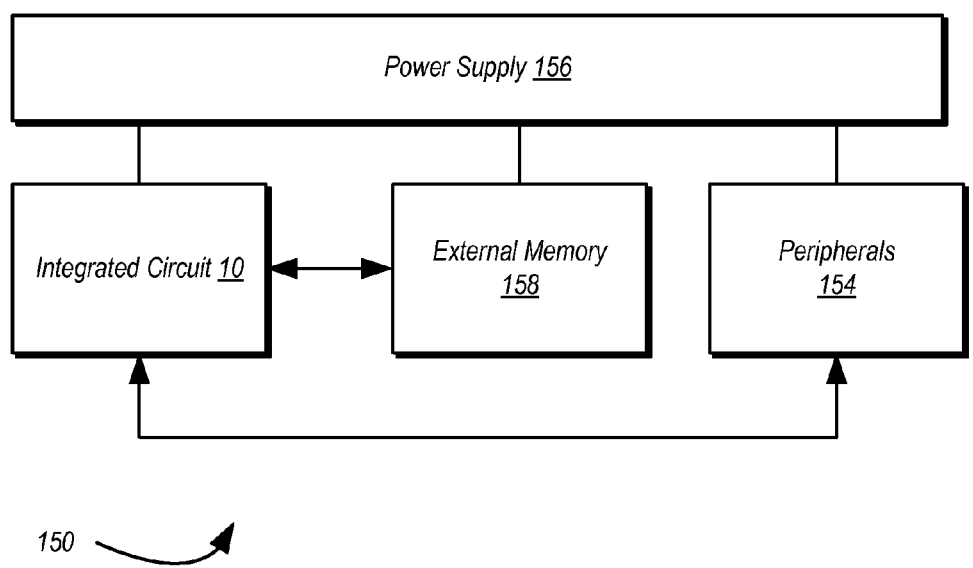
FIG. 5 is a block diagram of one embodiment of an exemplary system.

Turning next to FIG. 5, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A system comprising:
    a memory; and
    a memory controller coupled to the memory via a plurality of independent channels, wherein for each of the plurality of channels, the memory controller is configured to convey to the memory a corresponding at least one of a plurality of data strobe signals, and wherein the memory controller is further configured to perform periodic calibrations of the plurality of data strobe signals;
    wherein the memory controller includes a control circuit to cause the periodic calibrations of each of read data strobe signals and each of write data strobe signals to be performed concurrently with one another, and further configured to cause periodic refreshes of the memory to be performed across all channels concurrently, and wherein the memory is unavailable during the periodic calibrations and the periodic refreshes.

2. The system as recited in claim 1, wherein, prior to performing the periodic calibrations, the memory controller is configured to receive respective acknowledgements from each of the plurality of channels that they are not currently performing a self-refresh.

3. The system as recited in claim 1, wherein the memory controller include a timer circuit configured to determine that a first predetermined time has elapsed since a previous instance of the periodic calibrations, and further configured to determine that a second predetermined time has elapsed since a previous instance of the periodic refreshes.

4. The system as recited in claim 3, wherein the memory controller is configured to initiate an instance of the periodic calibrations responsive to the timer circuit indicating that the first predetermined time has elapsed since a most recent previous instance of the periodic calibrations.

5. The system as recited in claim 4, wherein the memory controller is configured to inhibit any portion of the memory from entering a self-refresh mode during performance of the periodic calibrations.

6. The system as recited in claim 3, wherein the memory controller is configured to initiate a refresh of all banks of the memory responsive to the timer circuit determining that the second predetermined time has elapsed since a most recent previous instance of the periodic refreshes.

7. The system as recited in claim 1, wherein for each of the channels, the memory controller is configured to convey a corresponding read data strobe signal and a corresponding write data strobe signal.

8. The system as recited in claim 7, wherein for each of the plurality channels, the memory controller is configured to perform the periodic calibrations by aligning the corresponding read data strobe signal to data to be read from the memory and by aligning the corresponding write data strobe signal to data to be written to memory.

9. A method comprising:
    performing, in a memory subsystem, periodic calibrations of a plurality of data strobe signals conveyed from a memory controller to a memory, wherein each of the plurality of data strobe signals is associated with a respective one of a plurality of independent channels coupled between the memory controller and the memory, and wherein the periodic calibrations are performed concurrently for all of the plurality of channels; and
    blocking accesses to the memory during the performing of the periodic calibrations.

10. The method as recited in claim 9, further comprising periodically performing periodic refreshes across all of the plurality of independent channels concurrently, wherein accesses to the memory are blocked during the performing of the periodic refreshes.

11. The method as recited in claim 9, further comprising the memory controller receiving indications on each of the channels that they are not currently performing a self-refresh.

12. The method as recited in claim 9, further comprising a timer indicating when a first predetermined time has elapsed since a most recent previous instance of periodic calibrations and when a second predetermined time has elapsed since a most recent previous instance of the periodic refreshes.

13. The method as recited in claim 12, further comprising initiating a periodic calibration of the plurality of data strobe signals responsive to elapsing of the first predetermined time.

14. The method as recited in claim 12, further comprising initiating a refresh of all banks of the memory responsive to elapsing of the second predetermined time.

15. The method as recited in claim 9, further comprising the memory controller conveying, to the memory, a plurality of read data strobe signals each associated with a corresponding unique one of the plurality of channels and a plurality of write data strobe signals each associated with a corresponding unique one of the plurality of channels.

16. The method as recited in claim 15, wherein performing the periodic calibrations includes aligning each of the plurality of read data strobe signals to data read from the memory, and further comprises aligning each of the plurality of write data strobe signals to data to be written to the memory.

17. An integrated circuit comprising:
a memory controller configured to communicate with a memory via a plurality of independent channels, wherein the memory controller is configured to convey in each of the plurality of independent channels at least one of a plurality of data strobe signals, and wherein the memory controller is configured to perform periodic calibrations of the data strobe signals;
wherein the memory controller includes a control circuit configured to initiate the periodic calibrations of the data strobe signals, wherein the periodic calibrations are performed concurrently for all of the plurality of independent channels such that the memory is unavailable for normal accesses during performance of the periodic calibrations.

18. The integrated circuit as recited in claim 17, wherein the control circuit is further configured to initiate periodic all-bank refresh of the memory across all channels concurrently such that the memory is unavailable for normal accesses during the periodic all-bank refreshes.

19. The integrated circuit as recited in claim 17, wherein performing the calibrations comprises aligning, in each of the plurality of channels, a respective read data strobe signal with data to be read from the memory and further comprises aligning, in each of the plurality of channels, a respective write data strobe signal with data to be written to the memory.

20. The integrated circuit as recited in claim 17, wherein the memory controller is configured to receive to respective acknowledgements from each of the plurality of channels that they are not currently performing a self-refresh prior to performing the periodic calibrations.

* * * * *